(12) United States Patent
Gagnon et al.

(10) Patent No.: US 8,324,580 B1
(45) Date of Patent: Dec. 4, 2012

(54) PHOTOMULTIPLIER TUBE WITH INTEGRATED FAST ANALOG-TO-DIGITAL CONVERSION FOR EVENT DERANDOMIZER AND DIGITAL TIME STAMPING

(75) Inventors: Daniel Gagnon, Twinsburg, OH (US); Kent Burr, Buffalo Grove, IL (US)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 0 days.

(21) Appl. No.: 13/153,611

(22) Filed: Jun. 6, 2011

(51) Int. Cl.
*G01T 1/161* (2006.01)
(52) U.S. Cl. ................................. 250/363.09
(58) Field of Classification Search .............. 250/361 R, 250/363.09
See application file for complete search history.

(56) References Cited

U.S. PATENT DOCUMENTS

| | | | |
|---|---|---|---|
| 4,862,004 A | * | 8/1989 | Koike et al. ............... 250/369 |
| 6,121,619 A | * | 9/2000 | Johnsen et al. ............... 250/369 |
| 7,633,057 B2 | * | 12/2009 | Cooke et al. ............... 250/252.1 |
| 7,723,694 B2 | | 5/2010 | Frach et al. |
| 2007/0257193 A1 | * | 11/2007 | Macciocchi ............... 250/341.5 |
| 2008/0083870 A1 | * | 4/2008 | Malmin et al. ............. 250/252.1 |

FOREIGN PATENT DOCUMENTS

| | | |
|---|---|---|
| JP | 2005-331458 | 12/2005 |
| WO | WO 2006/111883 | 10/2006 |

OTHER PUBLICATIONS

U.S. Appl. No. 13/343,541, filed Jan. 4, 2012, Burr, et al.
U.S. Appl. No. 13/091,985, filed Apr. 21, 2011, Burr, et al.
U.S. Appl. No. 13/091,928, filed Apr. 21, 2011, Mann, et al.

\* cited by examiner

*Primary Examiner* — David Porta
*Assistant Examiner* — Casey Bryant
(74) *Attorney, Agent, or Firm* — Oblon, Spivak, McClelland, Maier & Neustadt, L.L.P.

(57) ABSTRACT

A digital photosensor that includes a photomultiplier tube (PMT) including a power distribution circuit, the PMT outputting an analog signal in response to received light; an analog-to-digital converter (ADC) to receive the analog signal and to generate a digital signal; and a non-transitory memory storing manufacturing parameters of the PMT and operational parameters of the PMT, the operational parameters being calculated by a parameter calculation unit during operation of the PMT, wherein the PMT, the ADC, and the memory are integrated into a single housing.

18 Claims, 5 Drawing Sheets

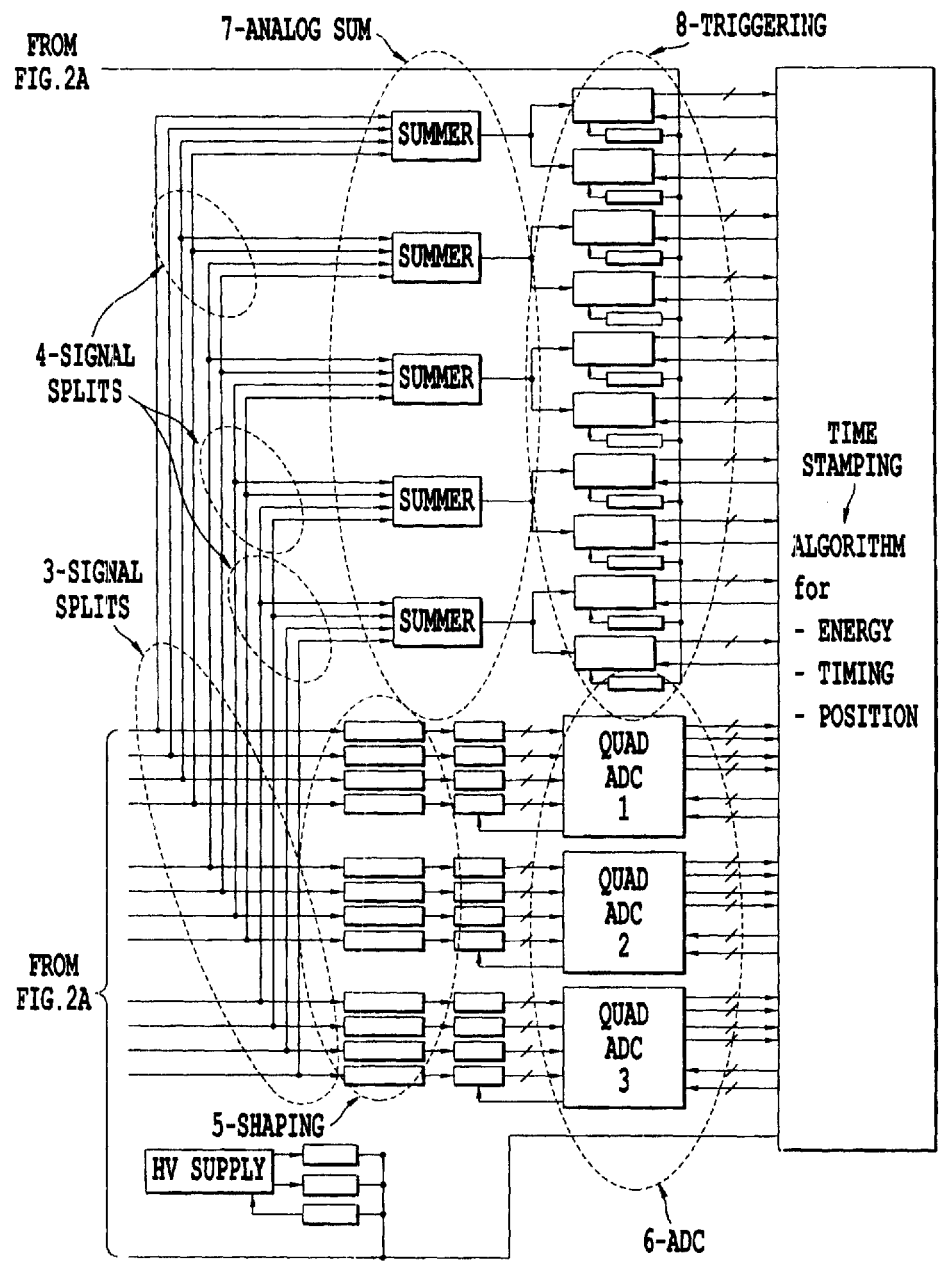
CONVENTIONAL ART  *Fig. 2B*

PHOTOMULTIPLIER TUBE WITH INTEGRATED FAST ANALOG-TO-DIGITAL CONVERSION FOR EVENT DERANDOMIZER AND DIGITAL TIME STAMPING

CROSS-REFERENCE TO RELATED APPLICATIONS

The application is related to application Ser. Nos. 13/091,985 and 13/343,541, the contents of which are incorporated herein by reference.

FIELD

Embodiments described herein relate generally to the design of a digital photosensor within a gamma ray scanner system.

BACKGROUND

A commercial gamma ray detector includes an array of scintillator crystals coupled to a transparent light guide, which distributes scintillation light over an array of photomultiplier tubes (PMTs) arranged over the transparent light guide. A position of a gamma ray interaction within the array of scintillator crystals is generally encoded by spreading the optical signal corresponding to the gamma ray over several PMTs grouped into a neighborhood. By measuring relative signal intensities from each of the PMTs in the neighborhood and applying statistical methods or performing a centroid calculation, the location of the gamma ray is decoded. Signals from the PMTs corresponding to a neighborhood are generally summed in the analog domain, and then timing is measured based on the leading edge of the summed signal.

PMTs fast enough to support Time-of-Flight information are based on the ability to perform an ultra-fast analysis of a response to the scintillation light. Typically, as shown in FIGS. 1A-1C, the leading edge of the response is used for timing information, while the integral of the whole signal is used to establish the energy of the event.

Generally, the use of PMTs in a real system is made difficult because of two main factors: (1) extraction of the energy and timing of the event, and (2) handling of the highly variable rate of arrival of events.

Extraction of the energy and timing is non-trivial since it is usually performed in a noisy background. Triggering and filtering of this type of signal requires specialized analog electronics and a costly development effort. This task is further complicated by the fact that PMTs have intrinsic characteristics (gain, average transit time, etc.), which requires that the processing circuitry be adaptable to multiple conditions.

Regarding the variability of the count rate, most radiation detection processes follow a stochastic process that is very accurately described by Poisson's law, which stipulates that, on average, the time between events is the reciprocal of the number of counts collected in one second. However, in actuality, the time varies according to an exponential distribution. In practice, if one designs a system to accept one count every millisecond and the process is expected to generate one thousand counts per second, the system will only capture around 74% of the counts.

Accordingly, conventional detectors include highly adaptable front-end systems to adjust a multitude of parameters. In some instances, e.g., for gain adjustment, the dynamic range can become too large for the range of adjustment, and the sorting of parts is sometimes necessary. For example, PMTs with similar gains can be connected to one common subsystem to decrease the range this particular system has to handle. Further, to address problems with the count rate, a higher bandwidth system needs to be constructed so that fewer events are lost.

FIGS. 2A and 2B illustrate a conventional PET system, with the corresponding processing steps superimposed. Twelve PMTs are illustrated in FIG. 2A. First, each of the PMT output signals are pre-amplified using variable gain amplifiers, each of which has an adjustable gain and delay. See (1) and (2) in FIG. 2A. The pre-amplified signals are then split (3) into two sets, one for determining the timing of an event, and one for determining the energy of the event. The first set of signals are further split (4) prior to being input into a series of analog summers (7), corresponding to different trigger zones, in this case, five trigger zones. The summed signals are then passed to triggering circuits (8), which output the triggering signals to a digital processing circuit. Meanwhile, the second set of signals are shaped and filtered (5) and then converted to digital signals using quad analog-to-digital converters (6), and then passed to the digital processing circuit. The digital processing circuit uses algorithms to determine the position, timing, and energy of the event.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A and 2B illustrate conventional processing circuitry for processing PMT output signals;

DETAILED DESCRIPTION

Figure 1A:
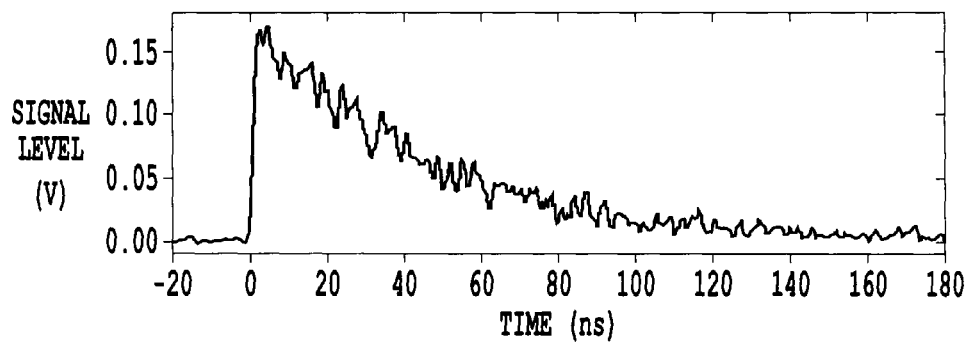
FIGS. 1A-1C illustrate a PMT response signal, from which an event time and energy are obtained.
Figure 1B:
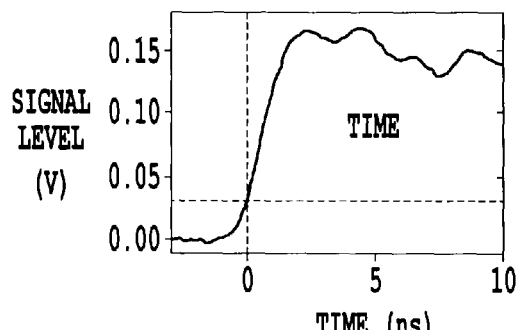

In one embodiment, a digital photosensor includes a photomultiplier tube (PMT) including a power distribution circuit, the PMT being configured to output an analog signal in response to received light; an analog-to-digital converter (ADC) to receive the analog signal and to generate a digital signal; and a non-transitory memory storing manufacturing parameters of the PMT and operational parameters of the PMT, the operational parameters being calculated by a parameter calculation unit during operation of the PMT, wherein the PMT, the ADC, and the memory are integrated into a single housing.

Further, in one embodiment, the digital photosensor further includes a buffer to continuously store the digital signal as a function of time.

In addition, in another embodiment, the digital photosensor further includes a trigger detection unit configured to monitor values of the digital signal to determine whether a predetermined trigger condition is met, and to output an internal trigger signal when the predetermined trigger condition is met.

Further, in another embodiment, the digital photosensor includes a trigger control unit configured to generate a trigger output signal based on the internal trigger signal and an external trigger signal from outside the digital photosensor, and a second output terminal to output the trigger out signal.

In another embodiment, the digital photosensor further includes a decimation unit configured to receive the trigger out signal from the trigger control unit and to determine a portion of the digital signal stored in the buffer to be output from the buffer, based on range parameters stored in a non-transitory memory and a trigger time associated with the trigger out signal, when receiving the trigger out signal from the trigger control unit. The decimation unit can be further configured to determine the portion of the digital signal stored in the buffer to be output from the buffer as corresponding to a predetermined time window determined based on the trigger time, a predetermined time period, and a predetermined delay, wherein the range parameters stored in the non-transitory memory include the predetermined time period and the predetermined delay.

In another embodiment, the digital photosensor further includes a second non-transitory memory storing trigger parameters defining the predetermined trigger condition, wherein the trigger parameters are set by external input by a user.

In another embodiment, the manufacturing parameters stored in the non-transitory memory are set by external input by a user. The non-transitory memory stores the manufacturing parameters of the PMT, including at least one of a serial number of the PMT, a manufacture date of the PMT, an intrinsic gain of the PMT, a transit time of the PMT, and a blue light sensitivity of the PMT, dGain/dV (gain variation with voltage change), and dTransitTime/dV (transit time variation with voltage change).

In another embodiment, the digital photosensor further includes a first output terminal to output the digital signal, and a second output terminal to output the analog signal directly from the PMT.

Further, in another embodiment, the ADC is configured to sample the output analog signal at 1 GHz or greater. In another embodiment, the ADC is configured to sample the output analog signal with an accuracy of at least 8 bits.

In another embodiment, the digital photosensor further includes a variable amplifier configured to amplifier the analog signal to generate an amplified analog signal, which is input into the ADC.

In another embodiment, the digital photosensor further includes an energy calculation circuit configured to numerically calculate an integral of the digital signal over a predetermined time window relative to a time of the internal trigger signal.

In another embodiment, the digital photosensor further includes an input terminal configured to receive an external clock signal, wherein sample times of the ADC are synchronized with the external clock signal.

In another embodiment, the digital photosensor further includes a communication control unit configured to receive, from the decimation unit, information indicating the determined portion of the digital signal to be output; retrieve samples of the digital signal stored in the buffer, based on the information indicating the determined portion of the digital signal to be output; and output the retrieved samples of the digital signal.

In another embodiment, the communication control unit is further configured to output the retrieved samples or a corresponding filtered version of the retrieved samples stored in the buffer.

Further, in one embodiment, a gamma ray detector includes (1) a plurality of digital photosensors, each digital photosensor including a photomultiplier tube including a power distribution circuit, the PMT being configured to output an analog signal in response to received light; a corresponding analog-to-digital converter to receive the analog signal and to generate a digital signal; and a first output terminal to output the digital signal; and (2) a digital processing unit configured to receive the output digital signal corresponding to each photosensor of the plurality of photosensors.

Embodiments described herein relate to modifying a conventional, analog PMT to include the digitalization of the PMT analog output signal. The digital output signal can then be processed, filtered, temporarily delayed, or stored without suffering signal distortion or degradation.

Figure 3:
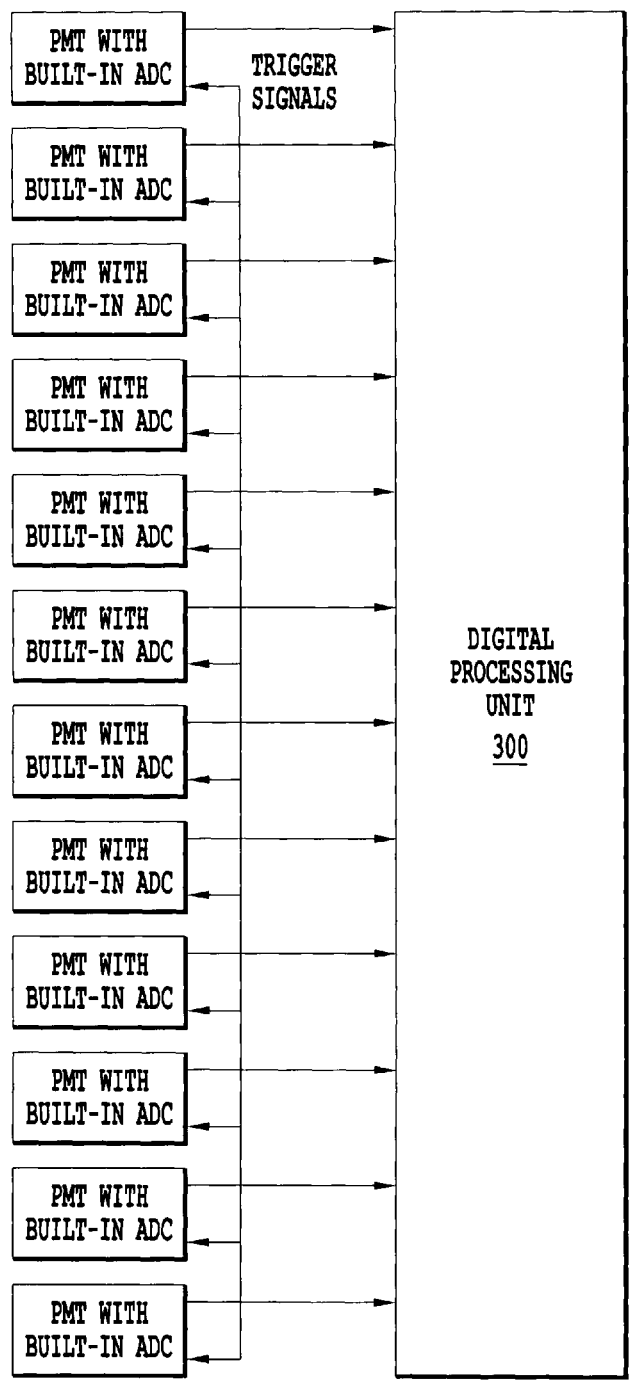
FIG. 3 illustrates an overall system design according to one embodiment.

As shown in FIG. 3, each digital PMT 100, which is described in more detail below, includes a built-in ADC, wherein digital output event data from each PMT is fed directly to a digital processing unit 300. With an appropriate dynamic range of each PMT's ADC, analog gain adjustment is not required. Moreover, fine intrinsic PMT delay (transit time) can be included in the conversion. Further, the filtering can be performed in the digital domain in the digital processing circuit 300. In addition, splitting signals is trivial as the signals are already digital.

Further, as shown in FIG. 3, internal trigger signals are generated in one digital PMT and sent to one or more neighboring PMTs, e.g., to PMTs forming a trigger zone. As discussed in more detail below, each digital PMT can generate an internal trigger signal based on predetermined or adjustable trigger conditions. The internally generated trigger signal is then passed to one or more other digital PMTs. Thus, each digital PMT has at least one input terminal for receiving an external trigger signal generated by another digital PMT. The trigger signal generated by one PMT may be passed to a plurality of digital PMTs so that the digital PMTs can be grouped into a plurality of trigger zones.

In the system shown in FIG. 3, the digital processing unit 300 executes algorithms to determine the energy, timing, and position of an event based on the time samples received from the digital PMTs. Alternatively, as discussed below, each digital PMT can also output an energy value associated with the digital signal, wherein the energy value represents a numerical integral of the digital signal over a predetermined time window, which is based on a trigger signal.

Figure 4:
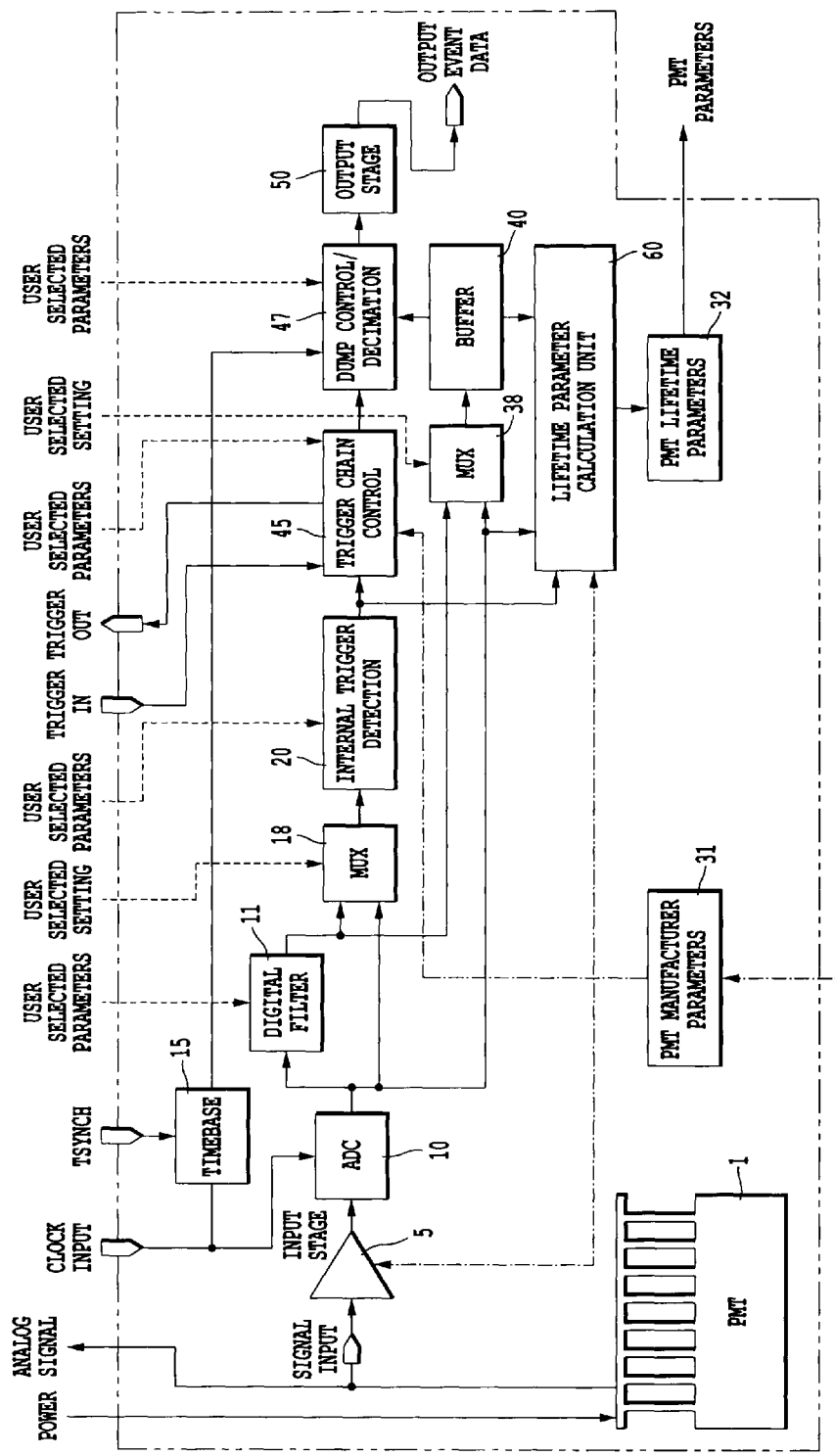
FIG. 4 illustrates elements in a digital PMT according to one embodiment.

FIG. 4 illustrates an embodiment of a digital PMT 100. As shown in FIG. 4, an "analog" PMT 1, which includes a photocathode, an anode, and a number of dynodes, has input terminals for receiving a high-voltage signal and a low power supply signal. The input power signals are distributed to the dynodes in a preset proportion, and the PMT outputs a ground signal and an analog output signal that varies in time in response to light received by the analog PMT. The analog signal output from the PMT 1 is input to an input-stage amplifier 5 for pre-amplification, which can be based on the intrinsic gain of the PMT. The gain of the amplifier can be controlled based on a value stored in the memory unit 31, which stores manufacturer parameters specific to the PMT. Additionally, the analog signal output from the PMT 1 can be passed through as an output of the digital PMT. If the analog signal is both passed through as a direct output signal and is also processed internally, as described below, an electrical buffer (not shown) can be used.

The amplified signal is output to an ADC 10, which produces a digital signal that is optionally filtered by the digital filter unit 11. In an alternative embodiment, multiple, slower ADCs can be used in place of ADC 10, wherein the respective outputs of the slower ADCs are merged to form the resultant digital signal. This multiple-ADC design is described in more detail in related application Ser. No. 13/091,985, which is incorporated herein by reference.

As shown in FIG. 4, the multiplexer 18 is configured to allow a user to select, via an external user-selected control signal, whether direct output of the ADC 10 or the digitally filtered signal is passed to the internal trigger detection unit 20. The user-selected control signal can alternatively be a parameter stored in a local memory (not shown).

The filtered or unfiltered digital signal output from the multiplexer 18 is analyzed by a trigger detection unit 20 to determine if trigger conditions are satisfied by the input digital signal. For example, if the value of the input digital signal exceeds, for a predetermined period of time, a predetermined threshold that is indicative of a pulse (detector event), an internal trigger signal is generated and output by the internal trigger detection unit 20 to the trigger chain control unit 45.

Note that the internal trigger detection unit 20 generates the internal trigger signal based on whether one or more trigger conditions are met. The trigger conditions are based on user parameters set by the user. For example, a trigger condition can be that the digital signal has more than a predetermined number of consecutive samples above a certain predetermined threshold, both the predetermined number and the predetermined threshold being user-set parameters. The user-set trigger parameters can be stored in a separate memory (not shown) within the digital PMT, can be internally stored within the internal trigger detection unit 20, or can be input directly into the digital PMT.

Note that, in an alternative embodiment, the filter unit 11 and the internal trigger detection unit 20 can be merged into a single unit that both filters and performs internal trigger detection.

Regardless of the result of the trigger analysis performed by the internal trigger detection unit 20, the unfiltered and filtered digital signals are output from the ADC 10 and the digital filter 11, respectively, to a multiplexer 38, which passes one of the two signals to a time buffer 40, based on a user-selected setting. Thus, the multiplexer 38 allows the user to determine at any time whether direct ADC output signals or digitally filtered data is buffered.

The internal trigger signal generated by the internal trigger detection unit 20 is output to the trigger chain control unit 45, which also receives an external "trigger in" signal, which can be triggered by one or more other digital PMTs. For example, a given digital PMT could receive an external trigger signal from one PMT located on its right-hand side or another located on its left-hand side. Based on the internal and external trigger signals and user-set parameters, the trigger chain control unit 45 determines whether an event has occurred. When the trigger chain control unit 45 determines that an event has occurred, it outputs a "trigger out" signal and activates dump control by sending a dump control signal to the dump control/decimation unit 47. In one embodiment, when an external trigger signal is received by the digital PMT, the internal trigger detection unit is prevented from generating another trigger signal for some programmable, predetermined period of time.

The dump control/decimation unit 47 identifies, based on user-set parameters, pertinent portions of the signal pulse that will be required to be output or that include pertinent information, and dumps, decimates, or discards the non-pertinent portions. The pertinent portions of the pulse include points obtained prior to the discovery of the pulse and a preset amount of data (or time) after the pulse has been detected. Data identified as being pertinent is obtained from the buffer 40 and sent to the output stage 50. Note that a subset of the data determined as pertinent may (and usually will) include ADC points prior to the discovery of the trigger. For example, the resolution of the output signal can vary for various parts of the signal, e.g., the leading edge, the trailing pulse, and in a pre-trigger window.

The dump control/decimation unit 47 receives information from the trigger chain control unit 45 that indicates which parts of the signal should be passed on to the output stage 50 and which parts of the signal should be discarded, decimated, or dumped. The dump control/decimation unit 47 uses a number of different techniques for determining which data should be discarded based on the receipt of the trigger information from the trigger chain control unit 45. For instance, limiting the amount of data output can be achieved by defining one or more time windows, with one of more decimation factors (which could be, e.g., unity, indicating no data reduction). Such a determination can be important because, at very high sampling rates, if all the data is going to be output, the transceivers must handle very high data rates. If only limited amounts of data need to be transferred (by use of the windows and decimation), then slower, lower-power transceivers can be used.

For example, in one embodiment, in response to the trigger signal and the dump control signal output by the trigger chain control unit 45, the dump control/decimation unit 47 determines that samples in the time range [t0−D, t0+R] should be output, where t0 is the timestamp indicating the time the trigger condition was obtained. The time stamp is computed by, e.g., counting the samples of clock signal by the timebase 15, as discussed below, and can be included in the trigger signal. Thus, in this example, the dump control/decimation unit 47 determines that samples in the time range of D ps prior to t0 and R ps after t0 should be selected to be output from the time buffer 40. The parameters R and D are set by (and modifiable by) the user and can be stored in an internal memory (not shown). In another embodiment, the dump control/decimation unit 47 selects a number of samples Nb from the samples stored in the time buffer 40, wherein the parameter Nb is a user-set parameter.

As shown in FIG. 4, the dump control/decimation unit 47 receives a count value from timebase 15. Timebase 15 is a counter that counts master clock cycles based on a master clock input. The timebase 15 can be "zeroed" by the Tsynch input, which allows each of the timebases in the various digital PMTs to be synchronized.

Once the dump control/decimation unit 47 determines what data, e.g., a data range, should be passed to the output stage 50 and what data should be discarded, decimated, etc., the dump control/decimation unit 47 passes the saved digital data to the output stage 50, which prepares the data for output. The output stage 50 transmits the selected samples to the digital processing circuit 300. The filtered samples or the unfiltered samples can be output, along with a time stamp associated with the samples. The output section stage 50 includes a packet framer unit, a TX buffer, a LVDS output unit, and a phase locked loop unit, which are described in more detail in related application Ser. No. 13/091,985.

As described above, the non-transitory memory unit 31 stores various PMT manufacturing parameters associated with the "analog" PMT, such as the intrinsic gain G, the average transit time TT, and the sensitivity S. The memory unit 31 can also store other information associated with the PMT, including a serial number and a manufacture date. Typically, the values stored in the memory unit 31 are entered once by the manufacturer, but in one embodiment, they can also be externally set at any time. Note, however, that the gain and transit time are generally functions of the HV power setting, which can be stored as well. Additional examples of useful information include dGain/dV (gain variation with voltage change) and dTransitTime/dV (transit time variation with voltage change).

The digital PMT shown in FIG. 4 additionally includes a memory 32 that stores PMT lifetime operational parameters associated with the PMT. The operational parameters are related to the lifetime use of the PMT and are calculated internally by the digital PMT, e.g., by the lifetime parameter calculation unit 60, described below. For example, useful operational parameters that can be calculated internally include (1) cumulative charge drawn from PMT, which is related to the number of pulses generated, pulse amplitude, and PMT intrinsic gain, and directly correlates with the PMT's "useful life"; (2) the after-pulse rate, which can indicate a failing vacuum in the tube, the ratio of after-pulse to pulse, and the amplitude of the after-pulse (proportional to intrinsic gain); (3) maximum operating bias voltage; (4) maximum instantaneous current drawn; and (6) number of triggers detected. Note that the parameters stored in memory 32 are continuously updated, irrespective of the use of the digital signal by the digital processing unit 300.

Figure 1C:
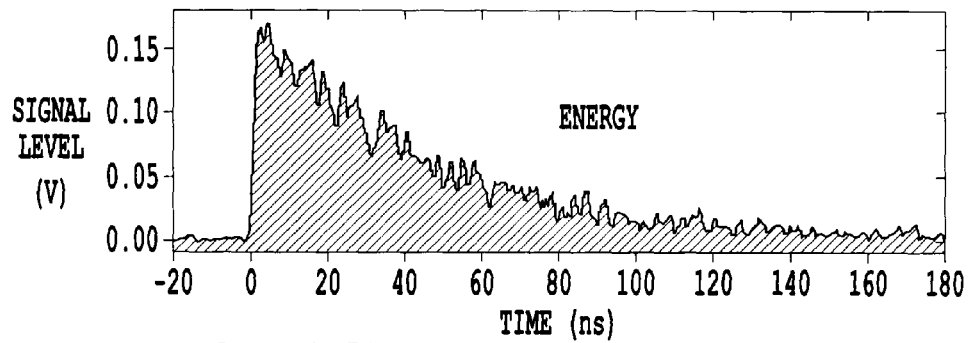

As noted above, the lifetime parameter calculation unit 60 calculates various parameters associated with the operational use of the PMT, based on various data, e.g., data obtained from the ADC 10, the internal trigger detection unit 20, and the buffer 40, as well as the PMT manufacturer parameters stored in memory 31. For example, the lifetime parameter calculation unit 60 calculates the total current drawn by the PMT and maximum instantaneous current drawn by the PMT. Further, when an internal trigger signal is generated by the internal trigger detection unit 20, the lifetime parameter calculation unit 60 calculates the energy associated with the event, which is calculated by numerically integrating the digital signal, as illustrated in FIG. 1C. In particular, the lifetime parameter calculation unit 60 keeps track of both the number of internal triggers and the cumulative charge of all detected events.

As shown in FIG. 4, the operational parameters calculated by the lifetime parameter calculation unit 60 are stored in memory 32 and can be output and read by a user.

Note also that memory units 31 and 32 can be separate memory units or can be separate portions of a single memory unit. Each memory unit 31 and 32 is a non-transitory memory. Additional memory units (not shown) can be used to store user-set parameters used by the digital filter 11, the multiplexers 18 and 38, the internal detection unit 20, the trigger chain control unit 45, and the dump control/decimation unit 47.

As shown in FIG. 4, the digital PMT can have several inputs and outputs. Inputs to the digital PMT include the power inputs to the PMT, the clock input, the Tsynch signal, the trigger-in signal, manufacturer parameters of the PMT, and various user-set parameters that affect the operation of the various sub-components of the digital PMT, as described above. For example, the user-set parameters can affect the operation of the digital filter 11, the internal trigger detection unit 20, the trigger chain control unit 45, the dump control/decimation unit 47, and the multiplexers 18 and 38. In addition, as noted above, any or all of the user-set parameters can be stored in an internal memory of the digital PMT.

While certain inputs have been described, these inputs have been presented by way of example only, and are not intended to limit the scope of the embodiments described herein.

In alternative embodiments, additional input signals, including additional user-set parameters, can be input into the digital PMT.

The outputs of the digital PMT can include the analog PMT signal, a trigger out signal, the output event data, which can include digital signal samples and associated time stamps, and the PMT lifetime parameters. In an alternative embodiment, all of these output values can be output via a serial interface under control of the output stage 50.

While certain outputs have been described, these outputs have been presented by way of example only, and are not intended to limit the scope of the embodiments described herein. In alternative embodiments, the digital PMT can have additional output signals.

The digital PMT illustrated by way of example in FIGS. 3 and 4 offers several advantages.

Figure 2A:
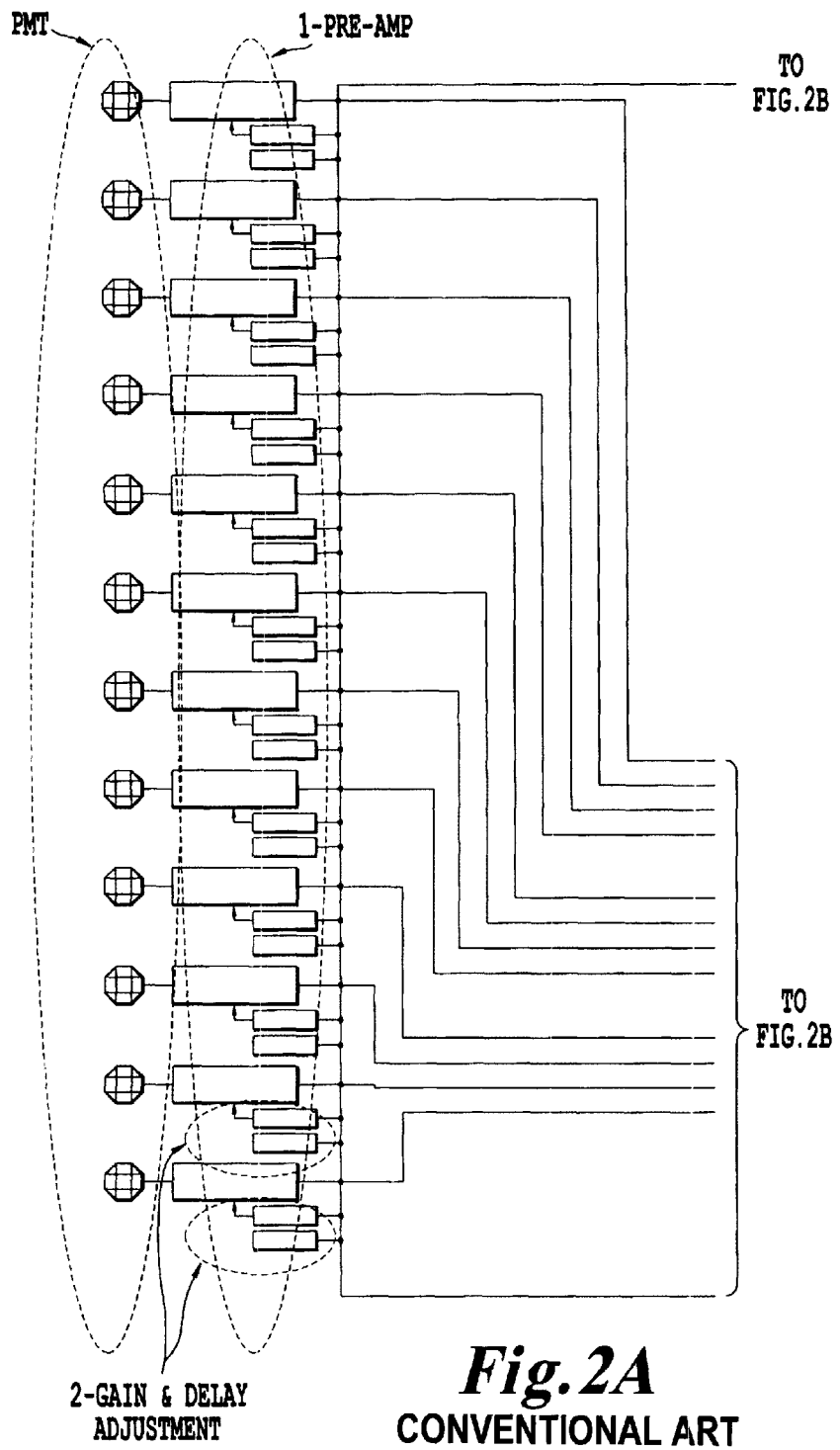

Since the complex analog sub-system shown in FIGS. 2A and 2B is replaced by one that is entirely digital, the resulting detector system is more versatile and robust. For example, since all filtering of the signals is performed in the digital domain, rather than in the analog domain, the filtering can be dynamically and continuously altered to optimize the performance of the system as the count rate varies. In an $^{82}$Rb cardiac scan, with a half-life of about 76 seconds, the count rate can vary by a factor of 500 or 600% over the course of a scan, a single analog system cannot be tuned to give the optimum performance throughout the entire examination. Thus, instead of making compromises between good performance at high count rates and low count rates, the entirely digital design allows the system to be programmed to always run with optimal parameters.

Another example of an advantage resulting from the digital PMT design described herein becomes apparent when comparing FIGS. 2A and 2B with FIG. 3. In the conventional approach of FIGS. 2A and 2B, the number of inputs into the analog summers 7 is hardwired. In other words, a single design decision has to be made a priori regarding the number of channels to sum, and this decision often forces compromises between good performance at low and at high count rates. Generally, when the count rate is low, the timing performance will be better if every PMT that receives any scintillation light from an event is included in the sum. Therefore, performance at low count rates is often optimized when including more input channels in the analog sum. As the count rate increases, however, including a larger number of input channels can degrade the timing performance since more noise from preceding pulses is included in the analog sum (a form of pulse pile-up). In the analog approach of FIGS. 2A and 2B, a compromise between low rate and high rate performance must be chosen. In contrast, since the summing in the digital PMT design is performed in the digital processing unit 300 rather than in the analog electronics, the digital PMT design allows the number of input channels included in the summation to be varied dynamically based on the count rate.

In addition, the digital PMT design also eliminates the need to design the electronics to account for a random event acquisition rate. Indeed, events detected by PMTs in a nuclear scanner follow a random process with a Poisson distribution. For instance, if the acquisition process described above is designed for a target useful rate, 37% of the events would be lost since they would be occurring faster than the average.

The digital PMT design also allows for the front-end digital processing unit to be used with a variety of detectors that use different scintillators or PMTs. As an example, in the conventional approach, the same analog front-end (e.g., shown in FIGS. 2A and 2B) would not support the use of both LYSO and LaBr3 as the scintillator material. In the conventional approach, if a switch was made from LYSO to LaBr3, the analog front-end, including the shaping filter, would have to be re-designed. In contrast, in the digital PMT design, a switch from LYSO to LaBr3 would only require a reprogramming of parameters used in the digital processing unit, which is much easier and less costly.

Moreover, even though the 2-GHz ADC in the digital PMT design can be a complex electronic device, the overall part count is clearly lower compared to the conventional analog approach, and therefore also offers a considerable cost advantage.

Another advantage is the ability to perform typically very complex operations with only a digital processor. The PMT incorporating fast ADC sampling allows the almost complete elimination of the analog section of a system that normally requires highly specialized technological expertise to develop and maintain.

A further advantage is the ability to time-stamp an event by providing an external clock. In this embodiment, the same clock is provided to the PMTs because the system uses multiple PMT signals to detect the same event.

Another advantage is the ability to buffer and de-randomize the readout of the event. Due to the nature of Poisson's Law, if the readout system matches the average of the stochastic process, a two-event deep buffer guarantees close to 92% of the event collection, while a five-event buffer guarantees 100%.

A further advantage is that, because the time stamping is done digitally, there is no need for building a complex TDC circuit.

Another advantage is that, because the full pulse is obtained digitally, processing is easily adapted to varying current conditions, such as the count rate. Similarly, pile-up rejection or compensation is easily implemented.

A further advantage, resulting from the use of a programmable trigger and buffer, is a significant reduction in the required volume of data to be transferred on the communication link. The ADC continuously samples the data and stores it in a buffer, but only a small portion of the buffered data is transferred when the trigger conditions are met. For example, when timing of a scintillation pulse is the primary interest, only a small number of samples from the leading edge of the pulse need to be transferred across the communication link when an event trigger is received.

Another advantage is that with the availability of intelligent circuitry integrated with and part of the PMT device, manufacturing and operational parameters can be saved and stay with the PMT during its useful life. As discussed above, useful manufacturing parameters include (1) serial number; (2) construction date; (3) intrinsic gain; (4) transit time; and (5) blue light sensitivity. Useful operational parameters include (1) cumulative charge drawn from PMT, which is related to the number of pulses generated, pulse amplitude, and PMT intrinsic gain, and directly correlates with the PMT's "useful life"; (2) other parameters that can be generated and saved, including the after-pulse rate, which can indicate a failing vacuum in the tube, the ratio of after-pulse to pulse, and the amplitude of the after-pulse (proportional to intrinsic gain); and (3) maximum operating bias voltage. Note that such operational parameters would be next to impossible to gather and save using conventional, independent circuitry since (a) the circuit would need to be "on" all the time, and (b) all circuitry in which the PMT is used would need the same features to get an adequate history of the use of the PMT. In contrast, the intelligent circuitry attached to the PMT, as disclosed herein, gathers information as soon as (and as long as) it is powered.

Note that because the PMT signal (pulse) is of relative high bandwidth, requirements on the sampling rate are somewhat severe. A sampling rate of at least 1 GHz is required, 2 GHz preferred, with 4 GHz being even better in order to accommodate faster scintillation crystals. Moreover, 8-bit accuracy is required, 10-bit is preferred, while 12-bit would be even better.

As noted above, the advantages of the digital PMT design on the overall PET system design are very clear. It is important to notice though, that a 1 GHz sampling rate (or more) will generally be required for those advantages to be realized.

The digital processing unit 300 shown in FIG. 3 includes a processor configured to process the signals received from the digital PMTs. As discussed above, the processing may include determining the timing, energy, and position for each event, and may include the application of many correction steps, based on prior calibrations, to improve the accuracy of the energy, position, and timing estimates. As one of ordinary skill in the art would recognize, the digital processing unit 300 can be implemented as discrete logic gates, as an Application Specific Integrated Circuit (ASIC), a Field Programmable Gate Array (FPGA) or other Complex Programmable Logic Device (CPLD). An FPGA or CPLD implementation may be coded in VHDL, Verilog, or any other hardware description language, and the code may be stored in an electronic memory directly within the FPGA or CPLD, or as a separate electronic memory. Further, the electronic memory may be non-volatile, such as ROM, EPROM, EEPROM, or FLASH memory. The electronic memory may also be volatile, such as static or dynamic RAM, and a processor, such as a microcontroller or microprocessor, may be provided to manage the electronic memory as well as the interaction between the FPGA or CPLD and the electronic memory.

Alternatively, the digital processing unit 300 may execute a computer program including a set of computer-readable instructions that perform the functions described herein, the program being stored in any of the above-described non-transitory electronic memories and/or a hard disk drive, CD, DVD, FLASH drive, or any other known storage media. Further, the computer-readable instructions may be provided as a utility application, background daemon, or component of an operating system, or combination thereof, executing in conjunction with a processor, such as a Xeon processor from Intel of America or an Opteron processor from AMD of America and an operating system, such as Microsoft VISTA, UNIX, Solaris, LINUX, Apple, MAC-OS and other operating systems known to those skilled in the art.

Once processed by the digital processing unit 300, the processed signals are stored in an electronic storage, and/or displayed on display. As one of ordinary skill in the art would recognize, the electronic storage may be a hard disk drive, CD-ROM drive, DVD drive, FLASH drive, RAM, ROM or any other electronic storage known in the art. The display may be implemented as an LCD display, CRT display, plasma display, OLED, LED or any other display known in the art. As such, the descriptions of the electronic storage and the display provided herein are merely exemplary and in no way limit the scope of the present advancements.

The system of FIG. 3 can also include an interface through which the gamma ray detection system interfaces with other external devices and/or a user. For example, the interface may be a USB interface, a PCMCIA interface, an Ethernet interface, or any other interface known in the art. The interface may also be wired or wireless and may include a keyboard and/or mouse or other human interface devices known in the art for interacting with a user.

While certain embodiments have been described, these embodiments have been presented by way of example only, and are not intended to limit the scope of the inventions. Indeed the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A digital photosensor, comprising:
   a photomultiplier tube (PMT) including a power distribution circuit, the PMT being configured to output an analog signal in response to received light;
   an analog-to-digital converter (ADC) to receive the analog signal and to generate a digital signal; and
   a non-transitory memory storing manufacturing parameters of the PMT and operational parameters of the PMT, the operational parameters being calculated by a parameter calculation unit during operation of the PMT,
   wherein the PMT, the ADC, and the memory are integrated into a single housing.

2. The digital photosensor of claim 1, further comprising:
   a buffer to continuously store the digital signal as a function of time.

3. The digital photosensor of claim 2, further comprising:
   a trigger detection unit configured to monitor values of the digital signal to determine whether a predetermined trigger condition is met, and to output an internal trigger signal when the predetermined trigger condition is met.

4. The digital photosensor of claim 3, further comprising:
   a trigger control unit configured to generate a trigger output signal based on the internal trigger signal and an external trigger signal from outside the digital photosensor; and
   an output terminal to output the trigger output signal.

5. The digital photosensor of claim 4, further comprising:
   a decimation unit configured to receive the trigger output signal from the trigger control unit and to determine a portion of the digital signal stored in the buffer to be output from the buffer, based on range parameters stored in the non-transitory memory and a trigger time associated with the trigger out signal, when receiving the trigger out signal from the trigger control unit.

6. The digital photosensor of claim 5, wherein the decimation unit is further configured to determine the portion of the digital signal stored in the buffer to be output from the buffer as corresponding to a predetermined time window determined based on the trigger time, a predetermined time period, and a predetermined delay,
   wherein the range parameters stored in the non-transitory memory include the predetermined time period and the predetermined delay.

7. The digital photosensor of claim 5, further comprising:
   a communication control unit configured to
     receive, from the decimation unit, information indicating the determined portion of the digital signal to be output;
     retrieve samples of the digital signal stored in the buffer, based on the information indicating the determined portion of the digital signal to be output; and
     output the retrieved samples of the digital signal.

8. The digital photosensor of claim 3, further comprising:
   a second non-transitory memory storing trigger parameters defining the predetermined trigger condition, wherein the trigger parameters are set by external input by a user.

9. The digital photosensor of claim 3, further comprising:
   an energy calculation circuit configured to numerically calculate an integral of the digital signal over a predetermined time window relative to the trigger time.

10. The digital photosensor of claim 1, wherein the manufacturing parameters stored in the non-transitory memory are set by external input by a user.

11. The digital photosensor of claim 10, wherein the non-transitory memory stores the manufacturing parameters of the PMT, including at least one of an intrinsic gain of the PMT, a transit time of the PMT, gain variation with voltage change, and transit time variation with voltage change.

12. The digital photosensor of claim 1, further comprising:
    a first output terminal to output the digital signal; and
    a second output terminal to output the analog signal directly from the PMT.

13. The digital photosensor of claim 1, wherein the ADC is configured to sample the output analog signal at a sampling rate of 1 GHz or greater.

14. The digital photosensor of claim 1, wherein the ADC is configured to sample the output analog signal with an accuracy of at least 8 bits.

15. The digital photosensor of claim 1, further comprising:
    a variable amplifier configured to amplifier the analog signal to generate an amplified analog signal, which is input into the ADC.

16. The digital photosensor of claim 1, further comprising:
    an input terminal configured to receive an external clock signal, wherein sample times of the ADC are synchronized with the external clock signal.

17. A gamma ray detector, comprising:
    a plurality of digital photosensors, each digital photosensor including
      a photomultiplier tube (PMT) including a power distribution circuit, the PMT being configured to output an analog signal in response to received light;
      an analog-to-digital converter (ADC) to receive the analog signal and to generate a digital signal; and
      a non-transitory memory storing manufacturing parameters of the PMT and operational parameters of the PMT, the operational parameters being calculated by a parameter calculation unit during operation of the PMT, wherein the PMT, the ADC, and the memory are integrated into a single housing; and
    a digital processing unit configured to receive the output digital signal corresponding to each photosensor of the plurality of photosensors.

18. The gamma ray detector of claim 17, wherein each digital photosensor comprises:
    a trigger detection unit configured to monitor values of the corresponding digital signal to determine whether a corresponding predetermined trigger condition is met, and to output a corresponding internal trigger signal when the corresponding predetermined trigger condition is met; and
    an input terminal configured to input an external trigger signal,
    wherein the external trigger signal input to one of the digital photosensors corresponds to the internal trigger signal of another of the digital photosensors.

* * * * *